United States Patent [19]

Dick

[11] Patent Number: 4,542,439
[45] Date of Patent: Sep. 17, 1985

[54] SURFACE MOUNT COMPONENT

[75] Inventor: Bernard M. Dick, Lee's Summit, Mo.

[73] Assignee: AT&T Technologies, Inc., New York, N.Y.

[21] Appl. No.: 625,273

[22] Filed: Jun. 27, 1984

[51] Int. Cl.⁴ .............................................. H05K 1/18
[52] U.S. Cl. .................................. 361/405; 338/324; 361/306; 357/68
[58] Field of Search ............. 339/17 C; 338/322, 324, 338/332; 361/306, 308, 309, 433, 397, 400, 401, 403–405, 413, 414, 417, 419, 420; 357/65, 68, 85

[56] References Cited

U.S. PATENT DOCUMENTS

| | | | |
|---|---|---|---|
| 2,522,713 | 9/1950 | Gray | 175/41 |
| 2,829,226 | 4/1958 | Ripley | 201/63 |
| 2,841,676 | 7/1958 | O'Brian | 338/324 |
| 2,939,060 | 5/1960 | Cotton | 361/308 |
| 3,060,356 | 10/1962 | Beyer | 361/308 |
| 3,114,807 | 12/1963 | Koda | 361/401 |
| 3,283,225 | 11/1966 | Kalstein | 361/306 |
| 3,955,124 | 5/1976 | Jones | 361/401 |

OTHER PUBLICATIONS

R. J. Klein Wassink et al., publication entitled "The Attachment of Leadless Electronic Components to Printed Boards", Philips Tech. Rev. 40, pp. 342-348, 1982, No. 11/12.
Pluggable, Solderless Component, Webb, IBM Tech. Discl. Bull., vol. 7, No. 3, Aug. 1964, p. 244.

Primary Examiner—G. P. Tolin
Attorney, Agent, or Firm—W. O. Schellin; G. W. Houseweart

[57] ABSTRACT

A surface mount component (11) has at least one lead (12) which extends from a body portion (16) of the component (11) along an axis (14) through the component. An outer end portion of the lead (12) is formed into a circuit termination (20) of a shape which, when projected onto a plane perpendicular to the axis, encompasses a projection of the body portion (16) of the component onto the plane.

13 Claims, 7 Drawing Figures

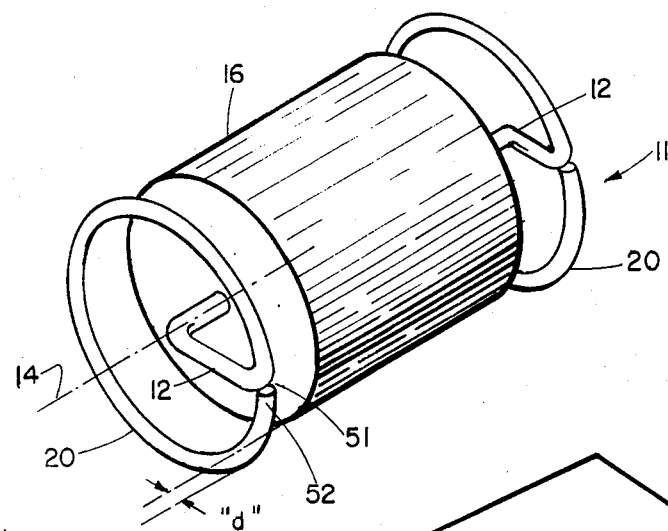
FIG. 4
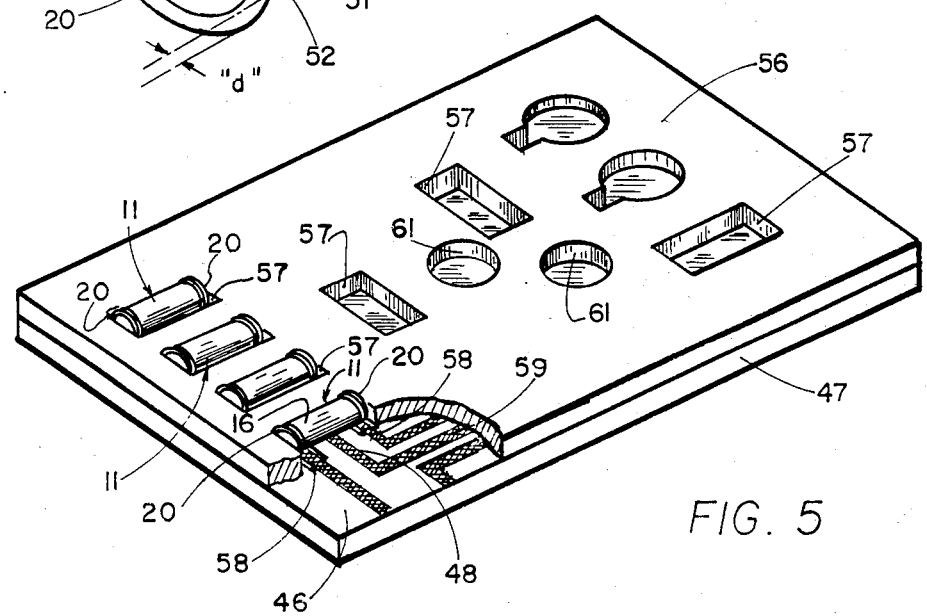
FIG. 5
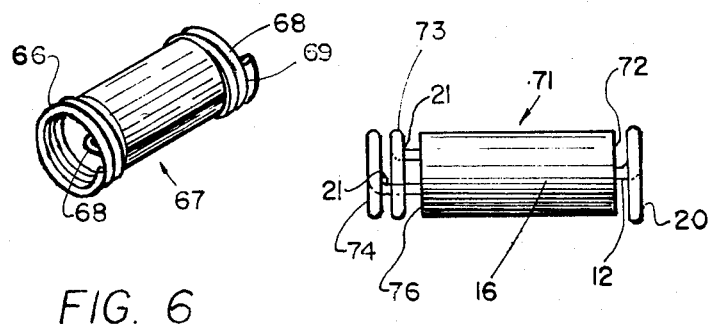
FIG. 6
FIG. 7

4,542,439

SURFACE MOUNT COMPONENT

TECHNICAL FIELD

This invention relates to a leaded electrical component which is adapted to be mounted to the surface of a substrate. The invention relates particularly to the lead structure of a component of a type which is known as a surface mount component and the leads of which are connected to contact pads on the surface of a substrate in a manner which characteristically lacks an insertion of ends of the leads through apertures in the substrate.

BACKGROUND OF THE INVENTION

In the past, one generally employed technique for mounting discrete electrical components to circuit boards involved the insertion of lead ends of the components through apertures in the boards and then soldering the inserted ends to contact pads about such apertures. Another mounting technique involves the use of a template for locating and holding the components to be assembled. The template is typically placed over a substrate to which components are to be assembled. The template has apertures of the size and shape of the components in predetermined positions which correspond to underlying contact pads for the components. A solder paste is preapplied to the contact pads. The leads of the components are foreshortened and bent downward such that the ends of the leads are pushed into contact with the solder paste when the components rest on the surface of the substrate between such contact pads. The assemblage of the substrate and the components, held in place by the template, is now placed into a solder reflow oven and heated to the melting temperature of the solder in the paste to cause the solder to reflow. After the assemblage has passed through the oven and the solder has resolidified, the components have become permanently mounted to the substrate. While the solder remains liquid, the components are retained in their respective positions by the template.

The assembly of electrical components by the latter technique results in occasional mounting defects. It has been observed that defects tend to occur when components become reoriented during their placement into the respective apertures of the template. As a result of such reorientation, circuit terminations of the leads apparently fail to make sufficient contact with the solder paste on the contact pads. Thus, during the reflowing of the solder, electrical and mechanical contact may break between the contact pad on the substrate and the circuit termination of the affected lead.

SUMMARY OF THE INvENTION

Surface mount components having leads formed in accordance with this invention overcome problems which, in the past, have been associated with such components. According to the invention, a surface mount component has a body and at least one lead which is terminated at the body to extend from the body through a plane which lies adjacent to an end of the body and perpendicular to an axis through the body. Each such lead has a circuit termination formed in a contact termination plane substantially parallel to such plane adjacent to such end of the body of the component. The circuit termination of the lead is shaped to a substantially closed contact shape in the contact termination plane which has contact surfaces which lie external to and encompass the projection of the component in the direction of its axis onto such contact termination plane. In a particular embodiment of the invention, outer bounds of the circuit terminations of two such leads on opposite sides of the body of the component extend beyond the area of such projection by a distance by which the body is to be mounted above a surface of a substrate.

BRIEF DESCRIPTION OF THE DRAWING

Various features and advantages of the invention will be best understood when the following detailed description is read in reference to the appended drawing, wherein:

FIG. 4 shows one of the components having had its leads formed in accordance with the invention;

FIG. 5 depicts a substrate to which components improved by this invention are assembled;

FIG. 6 shows a component featuring a variation of lead terminations as an alternate embodiment of the invention; and FIG. 7 is a three-leaded device, the leads of which are formed in accordance with the present invention.

DETAILED DESCRIPTION

Figure 1:
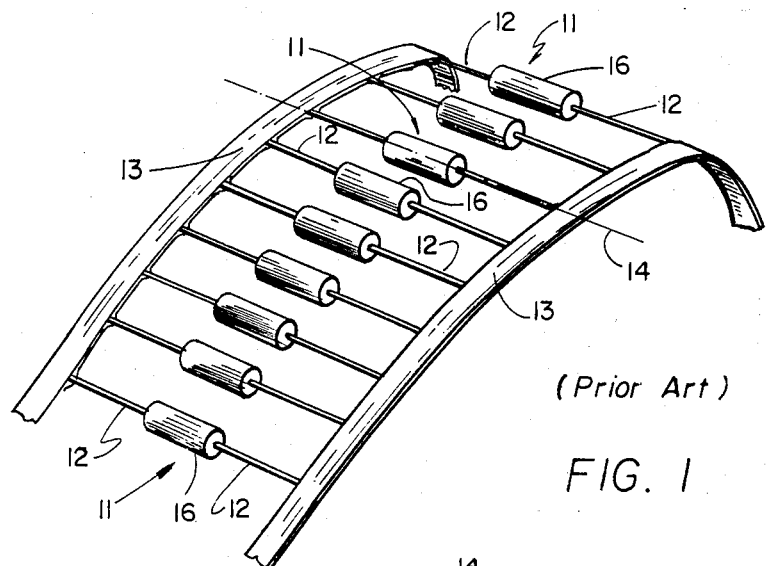
FIG. 1 shows a typical strip of axially leaded components, such as resistors, capacitors or diodes, for example.

Referring to FIG. 1, a plurality of typical "axially-leaded" electrical components 11 are held by their leads 12 at predetermined intervals to parallel extending strips of tape 13. The term "axially-leaded" refers to a well-known two-leaded package configuration for various types of discrete components, such as resistors, diodes or capacitors, for example.

The leads 12 of an axially-leaded component 11 extend along a common axis 14 from opposite sides of a body portion 16 of the component 11. Capturing the leads 12 of a plurality of the components 11 at preestablished intervals between two of the strips of tape 13 of indeterminate length provides a convenient way to store the components 11. Held by the strips of tape 13 the components may be reeled onto, and stored on, a reel (not shown) from which they may at a later time be removed to become mounted to circuit boards.

Figure 2:
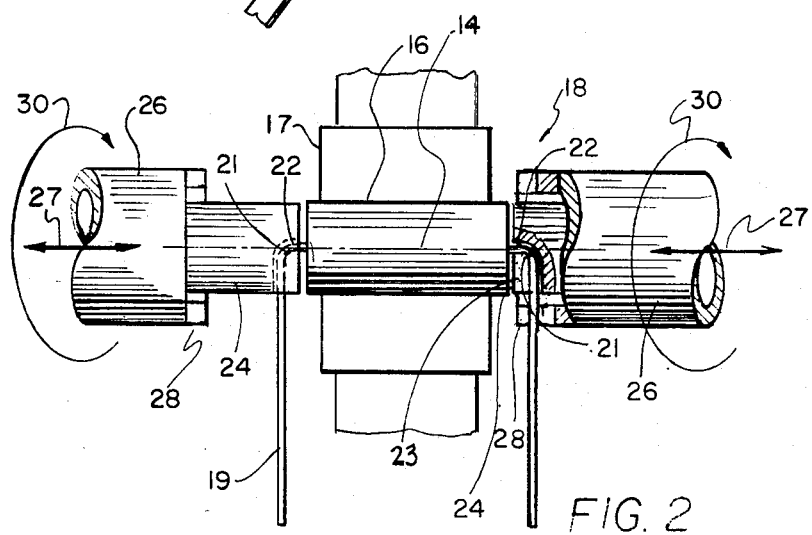
FIG. 2 shows one of the components of FIG. 1 separated from the strip and held by a preferred lead forming mechanism for forming lead terminations in accordance with the invention.

As cut from the strip, one of the components 11 is shown in FIG. 2 as it would appear before its leads are formed in accordance with the invention. A body portion 16 of the component 11 is seated in a holder 17 of a lead forming mechanism 18. The leads 12 of the component 11 are bent at right angles to the axis 14 and are cut to a predetermined length to allow an outer end portion 19 of each of the leads 12 to be formed into a circuit termination 20 (see FIG. 4) which is especially adapted to become mounted to the surface of a substrate, such as a circuit board. A right angle bend 21 in an inner lead portion 22 of each of the leads 20 adjacent to the body portion 16 of the component 11 is nested in a slotted recess 23 in the ends of respective mandrel shafts 24 of the mechanism 18. A forming sleeve 26 is slidably positioned about each of the shafts 24 to move toward the body 16 of the component 11 in the axial direction as indicated by arrows 27 until a forming projection 28 at the component end of the sleeve 26 moves into a coplanar position adjacent to the respective lead 12. The positioning movement enables the projection 28 to engage such lead by rotational movement in a plane perpendicular to the axis 14. In response to a rotation of the sleeves 26 in the direction of rotational arrows 30, the end portions 19 of the leads are formed into the circuit terminations 20 shown in FIG. 4.

In the preferred embodiment, the circuit terminations are circular. The precise shape of the circuit terminations 20 is determined by the cross-sectional shape of the mandrel shafts 24. While circular shapes of the terminations 20 are preferred for axially leaded components, different shapes of the terminations are possible within the scope of the invention. For example, leads having rectangular shaped circuit terminations may be desirable in certain assembly operations, even though some effort may be required to orient the surfaces of the terminations with respect to the surfaces of respective circuit boards. Forming the lead portions 19 into shapes other than circular shapes requires a lead forming mechanism which differs from the preferred mechanism 18 for forming the described circular terminations.

Figure 3:
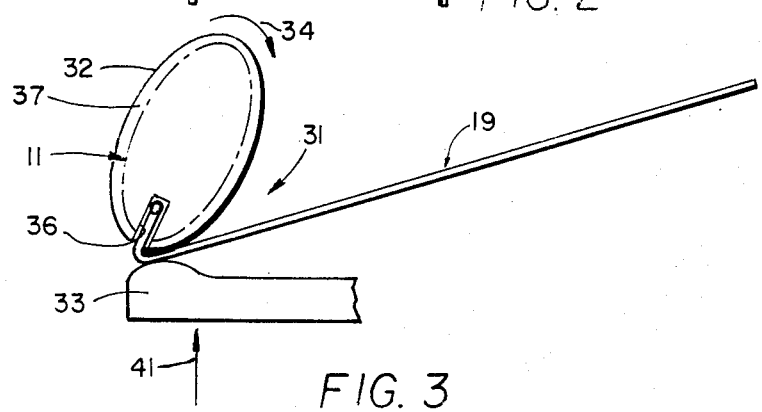
FIG. 3 an alternate lead forming mechanism for forming lead terminations of non-circular shapes.

FIG. 3 is a partial view of a lead forming mechanism 31 which uses mandrels 32 of cross-sectional shapes other than circular shapes. Such other than circular shapes of the mandrels 32 are, for example, desirable when the device 11 has a cross-sectional shape other than the previously referred-to circular shape. The mechanism 31 functions in a manner different than that of the mechanism 18 in that mandrels, such as the mandrel 32 shown in the partial view, are preferably rotated jointly with the component 11 (an outline of which is projected onto the mandrel in phantom lines) with respect to lead forming shoes 33. Thus, as the mandrel 32 rotates, for example, in the direction of an arrow 34, a slotted recess 36 in an end 37 of the mandrel 32 facing the component 11 retains the lead 12, which is displaced from the central axis of the oblong shape of the component 11, and pulls the outwardly extending end portion 19 of the lead through a forming engagement between the mandrel and the corresponding forming shoe 33. The forming shoe 33 is urged toward the mandrel with a bias force sufficient to form the end portion 19 of the respective lead against the mandrel, as indicated by arrow 41. The lead forming shoe 33, consequently, follows the contour of the mandrel 32 like a cam follower and urges the end portion 19 of the lead into contact with the shape of the mandrel 32. The cross-sectional shape of the mandrel 32 shown in FIG. 3 is oval. However, the described cam follower technique lends itself to forming end portions 19 of leads into circuit terminations of various cross-sectional shapes.

FIG. 4 shows one of the components 11, the leads 12 of which include the circuit terminations 20 of the preferred circular shape. The overall dimension across the circular shape of the terminations 20 is shown to exceed the diameter of the component by a radial difference dimension "d". Thus, when the component 11 is placed onto a flat surface, the circuit terminations 20 contact and rest on such surface (such as an upper surface 46 of a substrate, such as, for example, a circuit board 47 shown in FIG. 5), and the body portion 16 of the component 11 remains spaced from the surface by the dimension "d". Thus, the outer periphery of the shape of the circuit termination 20 encompasses a projection of the shape of the body 16 into the plane of the circuit termination. Typically, a minimum space of 0.020 inch is desired to relieve mounting stresses between the component 11 and the circuit board 47, to further air circulation about the component 11 and to allow for circuit leads 48 to be routed under the body portion 16 of the component 11 without the component 11 contacting such routed lead.

In further reference to FIG. 4, a small gap 51 is shown between an inner conductive portion 52 of each lead 12 and an outermost end 53 of the formed circuit termination 20 of the lead 12. It has been found that the width of such gap 51 may vary within a reasonable tolerance variation without affecting the advantages of the formed lead termination 20. Thus, while ideally, the end portion 19 formed into the circuit termination 20 is formed into a closed configuration onto itself, in a practical lead forming operation, there may remain an elastic deformation in the formed leads 12 such that the gap 51 opens as the component 11 is removed from the lead forming mechanism 18, even though the end portions 19 had been formed to a closed configuration. It should be realized that a substantial increase in the diameter over the diameter of the component 11 may be undesirable because of possible space limitations between adjacent components when the components 11 become mounted to the respective circuit board 47 as shown in FIG. 5.

The surface 46 of the circuit board 47 is covered with a mask 56 prior to the assembly of the components 11 to the circuit board. As shown in FIG. 5, the mask 56 is preferably of the same size as the circuit board to provide a ready reference for an alignment of cutouts 57 in the mask 56 in relationship to contact pads 58 which are intended to couple the circuit terminations 20 into a circuit pattern 59 on the circuit board. A preferred material for the mask 56 is a graphite pad, for example. Such a pad will not attach itself to the solder during the described reflow operation. While being somewhat flexible, the graphite material is sufficiently rigid to retain the components 11 as may be inserted into its cutouts 57. The mask 56 shows cutouts of various shapes, of which the rectangular cutouts are particularly adapted to accept the components 11, the leads of which have been formed into circuit terminations 20 as described herein.

Advantages of the circuit terminations 20 are noticed particularly in not having to orient the components to a predetermined orientation about their axis 14 to bring the terminations into contact with the contact pads 58. Thus as long as the mask 56 is properly aligned with circuit board 47, the components 11 are merely dropped into their respective rectangular cutouts 57 and the circuit terminations 20 move directly into contact with the contact pads 58 on the circuit board 47.

In addition to the rectangular cutouts 57 for mounting the components 11 as described herein, the mask 56 also shows other cutouts 61 of different shapes through which other components having leads not necessarily formed in accordance with the invention may be inserted. Even though theoretically it is possible to form two coplanar concentric circuit terminations on one cylindrical end of a component, such a lead configuration is not preferred. Consequently, components which become mounted through the circular cutouts 61 in the mask 56 may need to be oriented to position foot-like circuit terminations of leads (not shown) about the vertical to a predetermined orientation such as by aligning a mark on the component to an edge of the mask 56 or the circuit board 56.

FIG. 6 shows an alternate embodiment of the invention wherein circuit terminations 66 of a component designated generally by the numeral 67 have been formed into more than a single complete turn. In contrast to the circuit terminations 20 shown in FIG. 4 which feature a substantially complete, single circular turn formed in a single plane, the wire stock of leads 68 of the component 67 in FIG. 6 is wound into a helical configuration with an additional length of wire stock of the leads 68 forming at least a portion of an additional turn. An advantage in forming the circuit terminations 67 with more than a single turn is found in the ability of spaces 69 between the helically wound turns to absorb an excess of solder that may be present during the reflow step of the component mounting operation. On the other hand, the added turns of wire in each of the circuit terminations 66 tend to increase the overall length of the component 67 which may be undesirable when crowded component conditions exist on a circuit board.

FIG. 7 shows yet another feature of the invention which allows more than one of the circuit terminations 20 to be formed at one or both ends of a component designated generally by the numeral 71. In an illustrative example of the component 71, a single axial lead 12 extends to the one end 72 of the body 16 of the component 71. However, two leads, a second and third lead 73 and 74, extend from an opposite, second end 76 of the body 16 of the component 71. One or both of the second and third leads are offset from the central axis through the body 16 of the component 71.

Prior to forming the circuit terminations 20 on each of the three leads 12, 73 and 74, a right angle bend 21 is formed in each of the leads. In the particular example, shown in FIG. 7, the bends 21 in the leads 73 and 74 are offset longitudinally and preferably have the initial bend 21 directing the outer portions from which the terminations are formed into different radially outward pointing directions. Preferably the bend 21 in each of the leads 73 and 74 directs the respective leads away from the central axis through the component 71, to minimize the danger of the leads or their circuit terminations from coming into contact with each other. When the circuit terminations have been formed, the outer lead 74 extends through a central opening of the circuit termination of the inner lead 73. As may be realized, the leads 12, 73 and 74 may be formed, for example, into the preferred circularly shaped circuit terminations by a forming mechanism such as the mechanism 31 described in reference to FIG. 3. It should be understood that a mandrel (not shown) about which the two leads 73 and 74 are wound would feature two recesses in its end to accept the two leads which would then become engaged by forming shoes as shown in FIG. 3 for forming the respective outer ends into the lead terminations 20.

The above description of the component 11 as a preferred embodiment of the invention and the description of alternate embodiments embodying various modifications are believed to convey an understanding of a preferred embodiment of the invention and of some alternate embodiments thereof. It should be realized that various changes and modifications other than those already described are possible within the spirit and scope of the described invention.

What is claimed is:

1. An electrical surface mount component assembly, which comprises:

a substrate having a flat mounting surface and having a circuit pattern formed on such mounting surface, said circuit pattern including spaced contact pads;

at least one surface mount component including a body portion oriented longitudinally parallel and adjacent to said mounting surface of the substrate, said body portion housing the electrical component;

at least a first and a second lead having an inner end portion attached to the body portion and extending from the body portion parallel to said mounting surface of the substrate in a direction toward said spaced contact pads; and a circuit termination formed form an outer end portion of each lead into a shape which encompasses a projection of the shape of the body portion in the direction toward the formed termination, the termination of each lead being mounted to a respective one of the spaced contact pads to retain the component longitudinally oriented adjacent to the mounting surface of the substrate.

2. An electrical surface mount component assembly according to claim 1, wherein said first and second leads extend in opposite directions from said body portion and the respective two circuit terminations of the leads are substantially of cylindrical shape.

3. An electrical surface mount component assembly according to claim 2, wherein the body portion has a circular cross section with respect to a longitudinal axis through the body portion and the first and second leads extend along such axis in opposite directions from said body portion, and the circuit terminations of the leads are formed into cylindrical shapes about such axis.

4. An electrical surface mount component assembly according to claim 3, wherein the formed circuit terminations have an outer diametral dimension which exceeds in a radial direction the diametral dimension of the body portion by a predetermined distance to space the body portion of the component from the adjacent mounting surface of the substrate.

5. An electrical surface mount component assembly according to claim 4, wherein each of the circuit terminations is formed by a single, substantially closed, coiled turn of the outer end portion of each lead, and each of the circuit terminations is centered on a termination plane substantially perpendicular to the upper mounting surface of the substrate.

6. An electrical surface mount component assembly according to claim 5, wherein the circuit termination planes are spaced along said axis on opposite sides of and spaced from the body portion of the component.

7. An electrical surface mount component assembly according to claim 6, wherein the circuit terminations have substantially circular shapes in their respective circuit termination planes.

8. An electrical surface mount component assembly according to claim 4, wherein the circuit terminations are formed by helical turns of the outer end portions of the respective leads wound about the axis.

9. An electrical surface mount component assembly according to claim 8, wherein adjacent turns of the end portions of the leads are spaced sufficiently close to each other to retain liquid solder in capillary spaces between such adjacent turns.

10. An electrical surface mount component assembly according to claim 2, wherein at least two leads extend to the same side of the body portion of the component and at least two circuit terminations are formed in spaced relationship in adjacent planes perpendicular to the axis, an inner lead portion of at least one lead of the at least two leads extending outward from the body portion of the component through a central opening of the circuit termination of the lead terminating in the plane of the adjacent plates which is located adjacent to the body portion.

11. An electrical component adapted to be surface mounted to a substrate having a flat mounting surface with spaced contact pads thereon, the component comprising:

a body portion housing the component;

first and second leads, each lead having an inner end portion attached to the body and an outer end portion, the inner end portions of the leads extending in opposite directions away from the body portion along an axis through the body portion and into respective planes perpendicular to said axis and spaced from the body portion;

each lead having a circuit termination formed from the outer end portion thereof into a substantially closed shape lying substantially in its respective plane perpendicular to the axis and being larger in a diametral dimension than the body portion such that an imaginary projection of the body portion along the axis and onto the plane is encompassed by the termination;

the terminations of both the first and second leads having substantially the same shape and diametral extent, such that when mounted to the spaced contact pads on the flat mounting surface said axis is substantially parallel to the flat mounting surface.

12. A component as recited in claim 11 wherein the body portion is cylindrical and the closed shapes of the terminations are circular and have a diameter greater than the diameter of the body portion, such that a longitudinal axis of the body portion is parallel to the flat mounting surface and the body portion is spaced from the flat mounting surface when the terminations are mounted to the spaced contact pads on the flat mounting surface.

13. A component as recited in claim 11 including a third lead extending from the same side of the body portion from which the first lead extends, said third lead having an inner portion spaced from and parallel to the inner portion of the first lead and an outer portion formed into a closed shape termination substantially the same as the closed shape termination of the first lead, said closed shape termination of the third lead being spaced from the body and from the closed shape termination of the first lead.

* * * * *